United States Patent [19]

Wagner

[11] 3,814,994

[45] June 4, 1974

[54] FOUR TERMINAL POWER TRANSISTOR

[75] Inventor: Ronald M. Wagner, Seminole, Fla.

[73] Assignee: General Motors Corporation, Detroit, Mich.

[22] Filed: Mar. 7, 1973

[21] Appl. No.: 338,837

[52] U.S. Cl. .................... 357/43, 307/247, 357/81, 357/74, 357/68, 357/36

[51] Int. Cl. .................... H01l 11/00, H01l 15/00

[58] Field of Search ........ 317/234 A, 234 E, 234 G, 317/234 N, 235 Z; 307/248, 247

[56] References Cited

UNITED STATES PATENTS

| | | | |
|---|---|---|---|
| 3,233,125 | 2/1966 | Buie | 317/235 Z |
| 3,283,224 | 11/1966 | Erkan | 317/234 E |
| 3,325,700 | 6/1967 | Froschle | 317/234 G |
| 3,408,542 | 10/1968 | Dautzenberg | 317/234 G |
| 3,471,752 | 10/1969 | Pfander et al. | 317/234 G |
| 3,546,492 | 12/1970 | Barchok | 307/248 |

*Primary Examiner*—Andrew J. James
*Attorney, Agent, or Firm*—Robert J. Wallace

[57] ABSTRACT

A distinctive transistor circuit for power switching and radio frequency applications characterized by a unique interconnection of input and output networks to a distinctive transistor construction. The circuit includes a power transistor with two discrete emitter leads for a single emitter region of the power transistor. One emitter lead is electrically connected to the collector region of the transistor through a power output load. The other emitter lead is electrically connected to the base region of the transistor through an input voltage supply.

3 Claims, 2 Drawing Figures

FOUR TERMINAL POWER TRANSISTOR

The invention herein described was made in the course of work under a contract or subcontract thereunder with the Department of Defense.

BACKGROUND OF THE INVENTION

This invention involves a unique transistor circuit used in power switching and radio frequency applications. More particularly, it relates to a unique interconnection of input and output networks to a distinctive power transistor. The transistor has two discrete emitter leads which separately carry the input and output currents of the circuit.

It has already been recognized that the impedance of the leads of a transistor circuit must be kept as low as possible in order to obtain optimum power gain. For example, it is known to use a plurality of thin filamentary wires to minimize impedance between a transistor die and an emitter terminal lead of an enclosing housing, such as a TO-3 standard housing. In such a construction, the plurality of filamentary wires extend from an electrode on the transistor emitter region to a portion of a housing emitter terminal lead extending within the housing. This portion of the housing terminal lead can serve as a bonding post for the filamentary wires. The filamentary wires are electrically in parallel with one another having the emitter electrode as one node and the bonding post as the other.

For example, in a common emitter circuit, a base lead and an emitter lead of the transistor housing are connected across an input voltage supply. The voltage supply must have the potential to forward bias the emitter-base junction and inject current carriers into the transistor base region. This is referred to as turning the transistor "on". The output load to which power is to be delivered from the transistor is connected across the collector region and the emitter region of the transistor die by their respective leads. In prior art common emitter circuits, both the current in the input branch as well as the current in the output branch flow through the same emitter lead. As hereinbefore mentioned, a plurality of filamentary wires electrically in parallel between an emitter electrode of a transistor die and a housing terminal lead will reduce the impedance therebetween. However, it will not eliminate it. When there are high time rate currents flowing through the emitter lead, as is the case in power switching applications, there can still be an appreciable IX voltage drop between the die and the external circuitry lead due to this impedance. In prior art transistor circuits, the potential of the input voltage supply must be great enough to compensate for this voltage drop in the emitter lead and still apply a sufficient voltage across the base-emitter junction to turn on the transistor. I have discovered a simple, unique technique for reducing this voltage drop in the input branch of a common emitter circuit, thereby reducing the input voltage supply requirement.

OBJECTS AND SUMMARY OF THE INVENTION

It is, therefore, the object of this invention to provide means for reducing the input voltage required in a power transistor circuit. This reduction in voltage is realized most when the unique circuit is used in power applications. This invention involves a transistor housing with two discrete emitter terminal leads, each of which is separately electrically connected to the same emitter of a transistor die. Provision is also made in the housing, as usual, for electrical connection to the base and collector regions of the die. One of the housing emitter terminal leads is electrically connected to the base region of the transistor through an input voltage supply. The other housing emitter terminal lead is electrically connected to the collector region of the transistor through an output load.

DESCRIPTION OF THE PREFERRED EMBODIMENT

Figure 1:
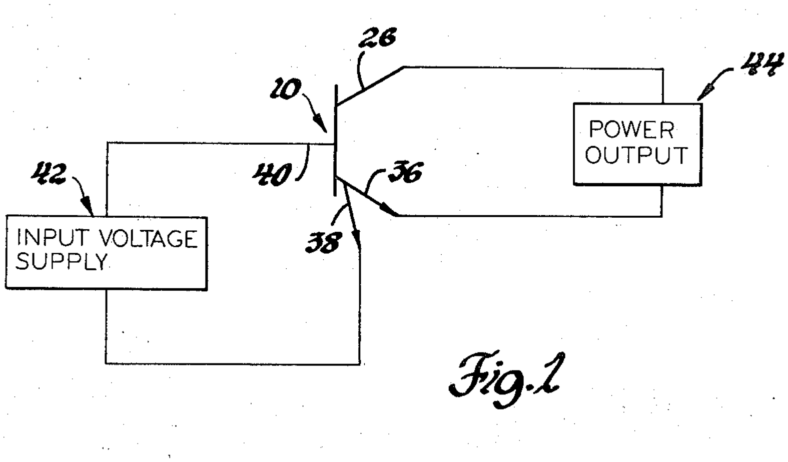
FIG. 1 is an electrical schematic of the invention.

For ease of illustration, power transistor 10 is shown in the drawing as a silicon planar device. By a power transistor, I mean a transistor that is capable of withstanding a continuous collector current in excess of 1 ampere. The transistor 10 includes a die 12 of silicon. A major portion 13 of die 12 is of N-type conductivity and serves as the collector region of the transistor. An island 14 of P-type conductivity inset in the die serves as a base region of the transistor. An island 16 of N-type conductivity inset in the base region 14 serves as an emitter region of the transistor. The emitter region 16 is shown as a rectangular island for convenience in illustration, but in practice it would preferably be interdigitated with base region 14. Although the transistor 10 in this example is described as a NPN silicon planar transistor, the principles of this invention are also applicable to PNP transistors, and to other transistor types such as diffused mesa transistors and conventional alloyed transistors.

Collector region 13 has an electrode 18 thereon. Similarly, base region 14 has an electrode 20 thereon and emitter region 16 has an electrode 22 thereon. Electrodes 18, 20, 22 are thin discrete contact pads of aluminum that facilitate making electrical connections to the various regions of the transistor die.

Figure 2:
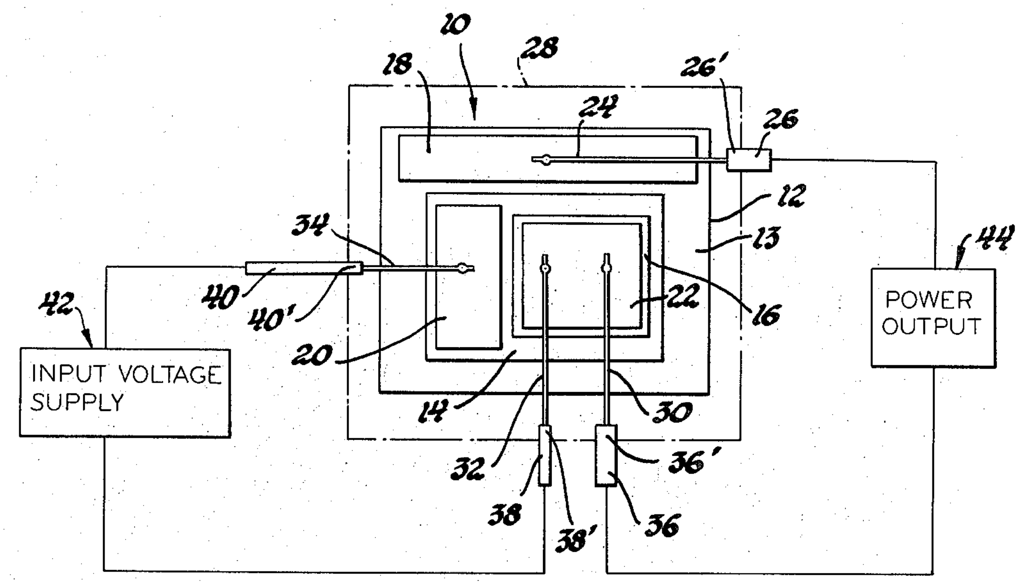
FIG. 2 is a diagrammatic view of the transistor and the input and output branches of the circuit embodied in this invention.

A housing 28, denoted by the dash/dot line in FIG. 2 encloses the transistor die 12. The type of housing is no more material to the transistor of this invention than it is to any other power transistor. Hence, housing 28 can be any of the usual power transistor housings such as TO-3, TO-36, TO-37 and TO-66 JEDEC standard housings. Typical elongated ferrous, KOVAR covered copper rods, 26, 36, 38 and 40 serving as housing terminal leads, extend through housing 28, and are insulated therefrom if the housing is of metal or other electrically conductive material. The portions of the housing terminal leads outside housing 28 provide leads for interconnection with external circuitry. The portions of the housing terminal leads 26', 36', 38' and 40' within housing 28 provide bonding posts for interconnection with the various regions of the transistor die. It should be noted that most housings such as TO-36 and TO-3 housings are of metal with the collector region of the transistor die conductively bonded directly to the base, or header, of the package. In such instance the housing itself is a collector lead, eliminating the need for a separate housing collector terminal lead. The conductive connection between the die and the housing, in such instance, can serve as a collector electrode. However, in this example, a separate housing terminal lead 26 for the collector region 13 of the transistor die is shown for ease of illustration.

A thin filamentary wire 24 extends from collector electrode 18 to bonding post 26' making electrical connection therebetween. Similarly, filamentary wire 34 extends from base electrode 20 to bonding post 40'. Particular attention should now be given to the emitter region 16 of the transistor die 12. As can be seen, there are two discrete housing terminal leads 36 and 38, which are separately electrically connected to emitter electrode 22 by filamentary wires 30 and 32, respectively. Filamentary wire 30 extends from emitter electrode 22 to bonding post 36', while filamentary wire 32 extends from the same emitter electrode 22 to a separate bonding post 38'. The filamentary wires 24, 30, 32 and 34 may be attached to their respective electrodes and bonding posts by ultrasonic or thermocompression bonding techniques. It should be emphasized that in my invention there are two discrete emitter leads which are separately electrically connected to a single emitter electrode. By a lead, I mean all conductive interconnections between an electrode on a semiconductor device die and external circuitry. In this example, each emitter lead consists of the housing emitter terminal lead and its respective filamentary wire interconnector between the housing emitter terminal lead and the emitter electrode. However, if desired, one may choose to employ a plurality of filamentary wires or a larger cross section conductor for electrical interconnection between the housing emitter terminal lead and the emitter electrode, to even further reduce impedance of the emitter lead.

The input voltage supply 42 is connected across housing base terminal lead 40 and housing emitter terminal lead 38. The input voltage supply 42 forward biases the base-emitter junction of transistor die 12. It may be a battery and alternator system or a series of networks which supply the required voltage. The interconnections from the input voltage supply 42 are soldered to package terminal leads 38 and 40. The power output 44 is a load through which the collector current, or output current, of the transistor 10 flows. It may be a single element or a series of networks which provide a desired function within the system that is used. The power output 44 is connected across collector terminal lead 26 and emitter terminal lead 36, as by soldering or the like.

The advantages of the separate emitter lead interconnection of this invention will be better understood by the use of a simplified example. If the current gain factor of the transistor is 15, and the current to be delivered to the load or output current must be 75 amperes, a 5 ampere input current to the base is required. In prior art transistor circuits, where there is only one emitter lead, the sum of the output and input currents, here 80 amperes, will flow through the single emitter lead. A typical inductance for the emitter lead may be $50 \times 10^{-9}$ henry. If the rate of rise of the 80 ampere current is 80 amperes per microsecond, the voltage drop due to the inductance of the emitter lead will be 4.0 volts. If the transistor base-emitter junction requires a voltage drop of 0.7 volts to forward bias the transistor and turn it on, an input voltage of at least 4.7 volts is necessary.

In my invention there are two discrete emitter leads which provide separate conductive paths to the single emitter electrode 22 of the transistor 10. As can be seen in the drawings, only the input current will flow through emitter lead in the input branch. The emitter lead in the output branch, however, carries the entire output current, which is substantially greater than the input current. Using the same current and impedance values in the prior art example, one will realize that there is only a voltage drop of 0.25 volts in the emitter lead in the input branch, since there is only the 5 ampere input current flowing through it. This means that the input voltage supply needs to be only 0.95 volts to forward bias the transistor emitter-base junction as compared to 4.7 volts in the prior art example. This reduces the input voltage requirement by a factor of more than 5.

It should be noted that this invention reduces the input voltage requirement at all collector currents. However, the most significant benefits are realized in power switching applications. It is particularly beneficial in high power applications, where the output current is in excess of 10 amperes. One skilled in the art will recognize that through the use of this invention, the voltage drop in the input circuit due to the resistance of the emitter lead will also be minimized by the separation of the input and output currents. It is, therefore, to be understood that although this invention has been described by certain specific examples thereof, no limitation is intended thereby except as defined in the following claims.

I claim:

1. A circuit for power switching applications including a distinctive power transistor having a unique interconnection between an emitter electrode of a power transistor die and external circuitry so as to minimize the voltage required by an input voltage supply to forward bias the emitter-base junction of the die, said circuit comprising means for producing an input voltage, an output load through which output current flows, a power transistor including a power transistor die having a base region with a base electrode thereon, a collector region with a collector electrode thereon, and an emitter region with an emitter electrode thereon, two discrete emitter leads separately electrically connected to said emitter electrode, a base lead electrically connected to said base electrode, a collector lead electrically connected to said collector electrode, means defining a common emitter circuit including said input voltage means, said output load, and said power transistor, said circuit having a common point of connection between said input voltage means and said output load at said emitter electrode, wherein one of said emitter leads is electrically connected to said base lead through said input voltage means so that said one emitter lead carries only current flowing through said input voltage means, and the other emitter lead is electrically connected to the collector lead through said output load so that said other emitter lead carries the entire output current flowing through said output load.

2. A circuit for high power switching applications including a distinctive high power transistor having a unique interconnection between an emitter electrode of a transistor die and external circuitry so as to minimize the voltage required by an input voltage supply to forward bias the emitter-base junction of the die, said circuit comprising means for producing an input voltage, an output load through which output current flows, a high power transistor including a high power transistor die and a surrounding housing, said die having a base region with a base electrode thereon, a collector region with a collector electrode thereon, and an emitter region with an emitter electrode thereon, two discrete housing emitter terminal leads, a housing base terminal lead, and a collector lead, each of said discrete housing emitter terminal leads separately electrically connected to said emitter electrode, said housing base terminal lead electrically connected to said base electrode, said collector lead electrically connected to said collector electrode, means defining a common emitter circuit including said input voltage means, said output load, and said high power transistor, said circuit having a common point of connection between said input voltage means and said output load at said emitter electrode, wherein one of said emitter leads is electrically connected to said base lead through said input voltage means so that said one emitter lead carries only current flowing through said input voltage means, and the other emitter lead is electrically connected to the collector lead through said output load so that said other emitter lead carries the entire output current to said load.

3. A circuit for power switching applications including a distinctive power transistor having a unique interconnection between an emitter electrode of a power transistor die and external circuitry so as to minimize the voltage required by an input voltage supply to forward bias the emitter-base junction of the die, said circuit comprising means for producing an input voltage, an output load through which output current flows, a power transistor including a power transistor die and a surrounding housing, said die having a base region with a base electrode thereon, a collector region, and an emitter region with an emitter electrode thereon, said collector region of said die electrically contacting a metallic portion of said housing, a housing base terminal lead, two discrete housing emitter terminal leads, said base terminal lead and both emitter terminal leads extending through said housing and electrically insulated therefrom, at least one filamentary wire electrically connecting said base electrode and said housing base terminal lead, at least one filamentary wire electrically connecting said emitter electrode and one of said housing emitter terminal leads, at least one filamentary wire electrically connecting said emitter electrode and the other housing emitter terminal lead, means defining a common emitter circuit including said input voltage means, said output load, and said power transistor, said circuit having a common point of connection between said input voltage means and said output load at said emitter electrode, wherein one of said housing emitter terminal leads is electrically connected to said housing base terminal lead through said input voltage means so that said one housing emitter terminal lead carries only current flowing through said input voltage means, and the other housing emitter terminal lead is electrically connected to said metallic portion of said housing through said output load so that said other housing emitter terminal lead carries the entire output current to said output load.

* * * * *